United States Patent
Wang et al.

(10) Patent No.: US 6,447,933 B1
(45) Date of Patent: Sep. 10, 2002

(54) FORMATION OF ALLOY MATERIAL USING ALTERNATING DEPOSITIONS OF ALLOY DOPING ELEMENT AND BULK MATERIAL

(75) Inventors: Pin-Chin C. Wang, Menlo Park, CA (US); Sergey Lopatin, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 2 days.

(21) Appl. No.: 09/845,616

(22) Filed: Apr. 30, 2001

(51) Int. Cl.$^7$ .............................. B32B 15/00; B05D 5/12

(52) U.S. Cl. ..................... 428/635; 257/750; 257/774; 427/99; 427/252; 438/618

(58) Field of Search ................................. 257/762, 750

(56) References Cited

U.S. PATENT DOCUMENTS 6,096,648 A * 8/2000 Lopatin et al. ............. 438/618
6,368,954 B1 * 4/2002 Lopatin et al. ............. 438/627

* cited by examiner

Primary Examiner—Deborah Jones
Assistant Examiner—Gwendolyn Blackwell-Rudasill
(74) Attorney, Agent, or Firm—Monica H. Choi

(57) ABSTRACT

An alloy material is formed on an underlying material, and the alloy material comprises an alloy doping element mixed into a bulk material. A first layer of material including the alloy doping element is deposited on the underlying material using a first type of deposition process. The first type of deposition process is corrosion resistive to the underlying material according to one aspect of the present invention. A second layer of material including the bulk material is deposited on the first layer of material using a second type of deposition process. A thermal anneal may be performed by heating the first layer of material and the second layer of material such that the alloy doping element is mixed into the bulk material to form the alloy material on the underlying material. The alloy doping element of the first layer of material deposited on the underlying material promotes adhesion of the alloy material to the underlying material. The present invention may be used to particular advantage when the underlying material is a diffusion barrier material deposited on sidewalls and a bottom wall of an interconnect opening, and when the alloy material is a copper alloy formed on the diffusion barrier material. In this manner, a plurality of deposition processes are used for forming a stack of layers of materials comprising the alloy material. The first type of deposition process for depositing the first layer of material on the underlying material is corrosion resistive to the underlying material. Corrosion to the underlying material is undesired because corrosion to the underlying material may degrade the adhesion of the interconnect to the underlying material to increase undesired electromigration failure of the interconnect. The second deposition process for depositing the second layer of material on the first layer of material may be a faster deposition process for depositing the bulk material of the alloy.

25 Claims, 5 Drawing Sheets

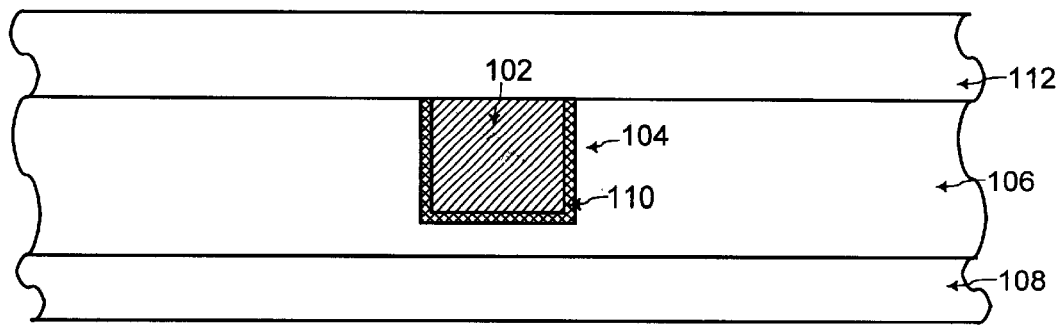
FIG. 1 *(Prior Art)*
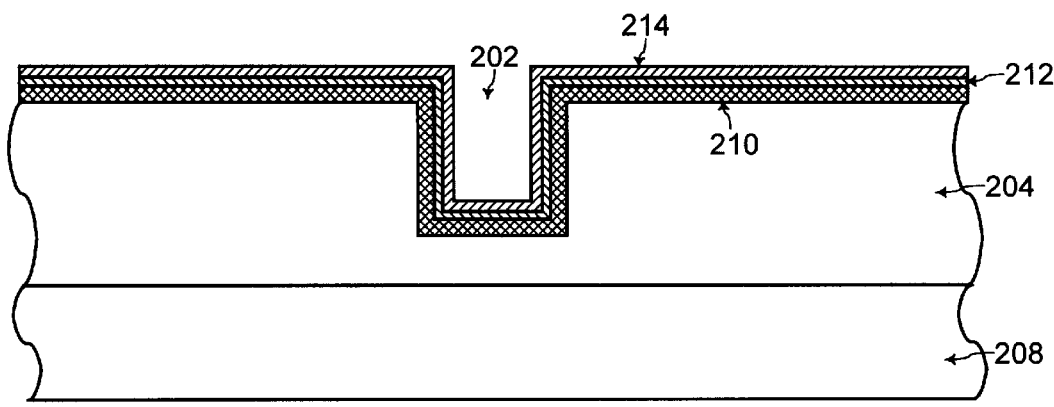
FIG. 2
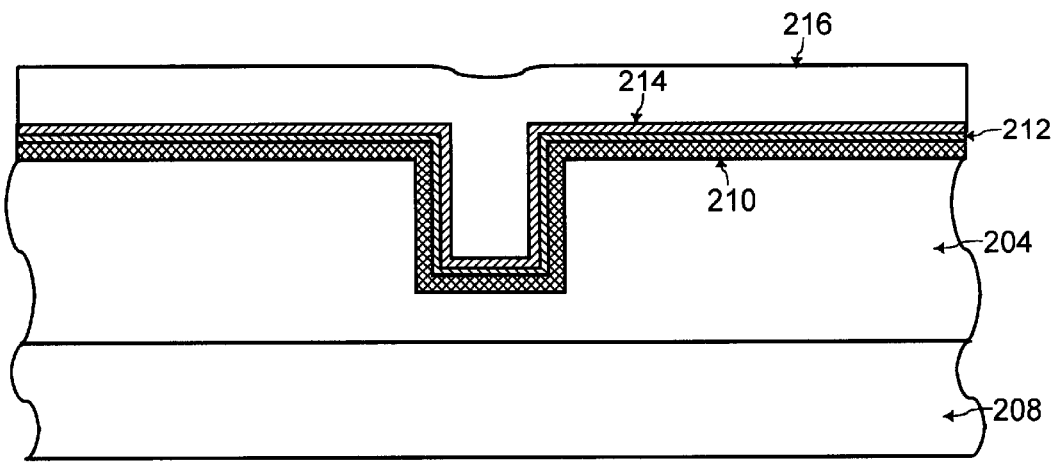
FIG. 3

FORMATION OF ALLOY MATERIAL USING ALTERNATING DEPOSITIONS OF ALLOY DOPING ELEMENT AND BULK MATERIAL

TECHNICAL FIELD

The present invention relates generally to fabrication of interconnect, such as copper interconnect for example, within an integrated circuit, and more particularly, to forming an alloy material, such as copper alloy for example, using alternating depositions of a layer of alloy doping element and a layer of bulk material, for use in forming interconnect.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Thus far, aluminum has been prevalently used for metallization within integrated circuits. However, as the width of metal lines are scaled down to smaller submicron and even nanometer dimensions, aluminum metallization shows electromigration failure. Electromigration failure, which may lead to open and extruded metal lines, is now a commonly recognized problem. Moreover, as dimensions of metal lines further decrease, metal line resistance increases substantially, and this increase in line resistance may adversely affect circuit performance.

Given the concerns of electromigration and line resistance with smaller metal lines and vias, copper is considered a more viable metal for smaller metallization dimensions. Copper has lower bulk resistivity and potentially higher electromigration tolerance than aluminum. Both the lower bulk resistivity and the higher electromigration tolerance improve circuit performance.

Referring to FIG. 1, a cross sectional view is shown of a copper interconnect 102 within a trench 104 formed in an insulating layer 106. The copper interconnect 102 within the insulating layer 106 is formed on a semiconductor wafer 108 such as a silicon substrate as part of an integrated circuit. Because copper is not a volatile metal, copper cannot be easily etched away in a deposition and etching process as typically used for aluminum metallization. Thus, the copper interconnect 102 is typically formed by etching the trench 104 as an opening within the insulating layer 106, and the trench 104 is then filled with copper typically by an electroplating process, as known to one of ordinary skill in the art of integrated circuit fabrication.

Unfortunately, copper is a mid-bandgap impurity in silicon and silicon dioxide. Thus, copper may diffuse easily into these common integrated circuit materials. Referring to FIG. 1, the insulating layer 106 may be comprised of silicon dioxide or a low dielectric constant insulating material such as organic doped silica, as known to one of ordinary skill in the art of integrated circuit fabrication. The low dielectric constant insulating material has a dielectric constant that is lower than that of pure silicon dioxide ($SiO_2$) for lower capacitance of the interconnect, as known to one of ordinary skill in the art of integrated circuit fabrication.

Copper may easily diffuse into such an insulating layer 106, and this diffusion of copper may degrade the performance of the integrated circuit. Thus, a diffusion barrier material 110 is deposited to surround the copper interconnect 102 within the insulating layer 106 on the sidewalls and the bottom wall of the copper interconnect 102, as known to one of ordinary skill in the art of integrated circuit fabrication. The diffusion barrier material 110 is disposed between the copper interconnect 102 and the insulating layer 106 for preventing diffusion of copper from the copper interconnect 102 to the insulating layer 106 to preserve the integrity of the insulating layer 106.

Further referring to FIG. 1, an encapsulating layer 112 is deposited as a passivation layer to encapsulate the copper interconnect 102, as known to one of ordinary skill in the art of integrated circuit fabrication. The encapsulating layer 112 is typically comprised of a dielectric such as silicon nitride, and copper from the copper interconnect 102 does not easily diffuse into such a dielectric of the encapsulating layer 112.

The patent application with Ser. No. 09/844,727 having title Depositing an Adhesion Skin Layer and a Conformal Seed Layer to Fill an Interconnect Opening, and having the same inventors and filed concurrently herewith, describes a process for forming an interconnect with minimized electromigration failure and void formation within the interconnect. This patent application with Ser. No. 09/844,727 is in its entirety incorporated herein by reference.

As described in patent application with Ser. No. 09/844,727, referring to FIG. 2, an adhesion skin layer 212 is deposited on the diffusion barrier material 210, and a conformal seed layer 214 is deposited on the adhesion skin layer 212. In FIG. 2, the diffusion barrier material 210 is the underlying material onto which the adhesion skin layer 212 is deposited. The diffusion barrier material 210 is similar to the diffusion barrier material 110 of FIG. 1 and is deposited onto the dielectric material of the insulating layer 204 which is formed on the semiconductor substrate 208 to surround the interconnect opening 202.

Referring to FIG. 3, the conductive material 216 is plated from the conformal seed layer 214. The adhesion skin layer 212 is typically comprised of an alloy material such as a copper alloy when the conformal seed layer 214 and the conductive material 216 are comprised of copper. The adhesion skin layer 212 comprised of the alloy material promotes adhesion of the conformal seed layer 214 to the diffusion barrier material 210.

Alternatively, as also described in patent application with Ser. No. 09/844,727, referring to FIG. 4, an adhesion skin layer 222 is deposited on the dielectric material of the insulating layer 204 at the sidewalls and the bottom wall of the interconnect opening. In FIG. 4, the dielectric material of the insulating layer 204 is the underlying material onto which the adhesion skin layer 222 is deposited.

A conformal seed layer 224 is deposited on the adhesion skin layer 222. Referring to FIG. 5, the conductive material 226 is plated from the conformal seed layer 224. The adhesion skin layer 222 is typically comprised of an alloy material such as a copper alloy when the conformal seed layer 224 and the conductive material 226 are comprised of copper. The adhesion skin layer 222 comprised of the alloy material promotes adhesion of the conformal seed layer 224 to the dielectric material of the insulating layer 204.

In the prior art, when the alloy material, such as copper alloy for example, of the adhesion skin layer 212 or 222 is deposited using a CVD (chemical vapor deposition) process, the underlying material (such as the diffusion barrier material 210 in FIG. 2 or the dielectric material of the insulating layer 204 in FIG. 4) is exposed to fluorine from a fluorine precursor used in the CVD (chemical vapor deposition) process. Fluorine is corrosive to such underlying material and degrades the performance of the integrated circuit.

Thus, a mechanism is desired for forming the alloy material of the adhesion skin layer 212 or 222, preferably without corroding the underlying material which may be comprised of the diffusion barrier material 210 or the dielectric material of the insulating layer 204. Corrosion to the underlying material is undesired because corrosion to the underlying material may degrade the adhesion of the interconnect to the underlying material to increase undesired electromigration failure of the interconnect.

SUMMARY OF THE INVENTION

Accordingly, in a general aspect of the present invention, alternating depositions of a layer of alloy doping element and a layer of bulk material are used for forming the alloy material on the underlying material.

In one aspect of the present invention, an alloy material formed on an underlying material comprises an alloy doping element mixed into a bulk material. A first layer of material including the alloy doping element is deposited on the underlying material using a first type of deposition process. In one aspect of the present invention, the first type of deposition process for depositing the first layer of material on the underlying material is corrosion resistive to the underlying material. A second layer of material including the bulk material is deposited on the first layer of material using a second type of deposition process. The alloy doping element of the first layer of material deposited on the underlying material promotes adhesion of the alloy material to the underlying material.

In another aspect of the present invention, a thermal anneal is performed by heating the first layer of material and the second layer of material such that the alloy doping element is mixed into the bulk material to form the alloy material on the underlying material.

In a further aspect of the present invention, the first type of deposition process is different from the second type of deposition process. For example, the first type of deposition process is an ALD (atomic layer deposition) process for depositing the first layer of material having a thickness in a range of from about 3 angstroms to about 50 angstroms. The ALD (atomic layer deposition) process is advantageous for depositing the first layer of material on the underlying material because an ALD (atomic layer deposition) process is corrosion resistive to the underlying material comprised of a diffusion barrier material or a dielectric material.

In a further aspect of the present invention, the second type of deposition process is a CVD (chemical vapor deposition) process for depositing the second layer of material having a thickness in a range of from about 3 angstroms to about 100 angstroms.

The CVD (chemical vapor deposition) process is advantageous for depositing the second layer of material because the CVD (chemical vapor deposition) process is a faster deposition process than the ALD (atomic layer deposition) process. Because the underlying material is covered with the first layer of material, the fluorine precursor of the CVD (chemical vapor deposition) process does not corrode the underlying material during the CVD (chemical vapor deposition) process for depositing the second layer of material.

According to another aspect of the present invention, the alternating depositions of the first layer of material and the second layer of material are repeated for increasing the thickness of the alloy material formed on the underlying material.

The present invention may be used to particular advantage when the alloy doping element is one of tungsten or tin and when the bulk material is copper for forming copper alloy. In addition, the present invention may be used to particular advantage when the underlying material is a diffusion barrier material deposited on sidewalls and a bottom wall of an interconnect opening, and when the alloy material is a copper alloy formed between the diffusion barrier material and a conformal seed layer of substantially pure copper formed on the alloy material. Alternatively, the underlying material is a dielectric material of an insulating layer surrounding an interconnect opening, and the alloy material is a copper alloy formed between the dielectric material of the insulating layer surrounding the interconnect opening and a conformal seed layer of substantially pure copper formed on the alloy material.

In this manner, a plurality of deposition processes are used for forming a stack of layers of materials comprising the alloy material. At least one of the plurality of deposition processes is conformal such that the alloy material is continuous according to one aspect of the present invention. The first type of deposition process for depositing the first layer of material on the underlying material is corrosion resistive to the underlying material according to another aspect of the present invention. The second deposition process for depositing the second layer of material on the first layer of material may be a faster deposition process for depositing the bulk material of the alloy. In any case, the alloy doping element of the first layer of material deposited on the underlying material promotes adhesion of the alloy material to the underlying material.

These and other features and advantages of the present invention will be better understood by considering the following detailed description of the invention which is presented with the attached drawings.

BRIEF DESCRIPTION OF THE DRAWINGS

FIG. 1 shows a cross-sectional view of a copper interconnect formed by copper filling a trench within an insulating layer, according to the prior art;

FIG. 2 shows a cross-sectional view of an adhesion skin layer and a conformal seed layer deposited on a diffusion barrier material at sidewalls and a bottom wall of an interconnect opening;

FIG. 3 shows a conductive material plated from the conformal seed layer of FIG. 2 for filling the interconnect opening;

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, 16, and 17 refer to elements having similar structure and function.

DETAILED DESCRIPTION

The present invention is described for formation of an alloy material comprising the adhesion skin layer 212 or 222 of FIGS. 2, 3, 4, and 5. However, the present invention may be applied for forming alloy material on an underlying material while avoiding corrosion of the underlying material for other applications, as would be apparent to one of ordinary skill in the art of integrated circuit fabrication from the description herein.

Figure 6:
FIGS. 6, 7, 8, 9, 10, and 11 show cross-sectional views for formation of an alloy material on a diffusion barrier material as the underlying material by using alternating depositions of a plurality of layers of material to avoid corrosion of the underlying diffusion barrier material, according to one embodiment of the present invention.

Referring to FIG. 6, an alloy material is formed on the diffusion barrier material 210 as the underlying material. The diffusion barrier material 210 may be deposited on the sidewalls and the bottom wall of the interconnect opening 202 as illustrated in FIGS. 2 and 3. The alloy material to be formed on the diffusion barrier material 210 may be for use as the adhesion skin layer 212 to promote the adhesion of the conformal seed layer 214 to the diffusion barrier material 210 as illustrated in FIGS. 2 and 3. The alloy material is comprised of an alloy doping element mixed into a bulk material. For example, for filling the interconnect opening 202 with copper, the alloy material is a copper alloy. In that case, the bulk material of the copper alloy is copper and the alloy doping element is comprised of one of tungsten, tin, aluminum, phosphorous, or nickel according to one embodiment of the present invention.

Referring to FIG. 6, for forming the alloy material on the underlying diffusion barrier material 210, a first layer of material 232 is deposited on the underlying diffusion barrier material 210. The first layer of material 232 is comprised of the alloy doping element and is deposited using a first type of deposition process that is corrosion resistive to the underlying diffusion barrier material 210 during deposition of the first layer of material 232. An example of a type of deposition process that is corrosion resistive to the underlying diffusion barrier material 210 is an ALD (atomic layer deposition) process which may be used for depositing the first layer of material 232. On the other hand, the conventional CVD (chemical vapor deposition) process typically uses a fluorine precursor that is corrosive to the underlying diffusion barrier material 210, and such a deposition process is avoided as the first type of deposition process for depositing the first layer of material 232.

In one embodiment of the present invention, the first layer of material 232 is the substantially pure alloy doping element. For example, for forming a copper alloy, the first layer of material 232 is comprised of one of substantially pure tungsten or substantially pure tin according to one embodiment of the present invention. In an alternative embodiment of the present invention, the first layer of material 232 is a copper alloy having a relatively large concentration of the alloy doping element. For example, the first layer of material 232 is comprised of a copper alloy with the alloy doping element being one of tungsten, tin, aluminum, phosphorous, or nickel having a concentration of greater than about 10 atomic percent in copper as the bulk material. ALD (atomic layer deposition) processes which may be used for depositing such a first layer of material 232 are known to one of ordinary skill in the art of integrated circuit fabrication.

Figure 7:
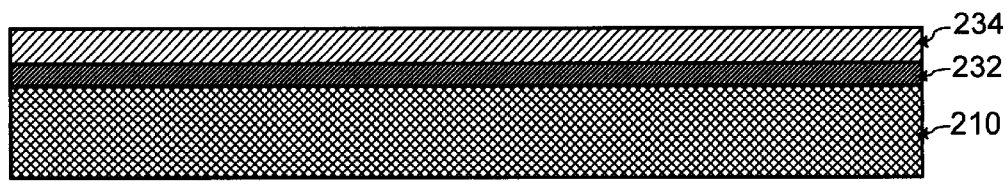

Referring to FIG. 7, after deposition of the first layer of material 232 using the first type of deposition process, a second layer of material 234 is deposited on the first layer of material 232 using a second type of deposition process. The second layer of material 234 comprises the bulk material of the alloy material to be formed on the underlying diffusion barrier material 210. For example, for forming a copper alloy, the second layer of material 234 is comprised of substantially pure copper according to one embodiment of the present invention. In an alternative embodiment of the present invention, the second layer of material 234 is a copper alloy having a relatively small concentration of the alloy doping element. For example, the second layer of material 234 is comprised of a copper alloy with the alloy doping element being one of tungsten, tin, aluminum, phosphorous, or nickel having a concentration of less than about 0.1 atomic percent in copper as the bulk material.

In one embodiment of the present invention, the second type of deposition process for depositing the second layer of material 234 is the same as the first type of deposition process for depositing the first layer of material 232. For example, when the ALD (atomic layer deposition) process is the first type of deposition process for depositing the first layer of material 232, the ALD (atomic layer deposition) process may also be the second type of deposition process for depositing the second layer of material 234. In that case, the thickness of the first layer of material 232 deposited using the ALD (atomic layer deposition) process is in a range of from about 3 angstroms to about 50 angstroms, and the thickness of the second layer of material 234 deposited using the ALD (atomic layer deposition) process is in a range of from about 3 angstroms to about 100 angstroms.

However, as known to one of ordinary skill in the art of integrated circuit fabrication, ALD (atomic layer deposition) processes are relatively slow (slower than CVD (chemical vapor deposition) processes) for depositing material. Thus, in an alternative embodiment of the present invention, the second type of deposition process for depositing the second layer of material 234 is different from the first type of deposition process for depositing the first layer of material 232.

In one embodiment of the present invention, the first type of deposition process for depositing the first layer of material 232 on the underlying diffusion barrier material 210 is the ALD (atomic layer deposition) process that is corrosion resistive to the underlying diffusion barrier material 210. The second type of deposition process for depositing the second layer of material 234 is the CVD (chemical vapor deposition) process such that the second layer of material 234 may be deposited at a faster rate. In that case, the thickness of the first layer of material 232 deposited using the ALD (atomic layer deposition) process is in a range of from about 3 angstroms to about 50 angstroms, and the thickness of the second layer of material 234 deposited using the CVD (chemical vapor deposition) process is in a range of from about 3 angstroms to about 100 angstroms.

CVD (chemical vapor deposition) processes are faster than ALD (atomic layer deposition) processes for depositing material as known to one of ordinary skill in the art of integrated circuit fabrication. In addition, since the underlying diffusion barrier material 210 is covered by the first layer of material 232, the diffusion barrier material 210 is not exposed to the corrosive fluorine precursor used during the CVD (chemical vapor deposition) process as the second type of deposition process for depositing the second layer of material 234.

Figure 8:
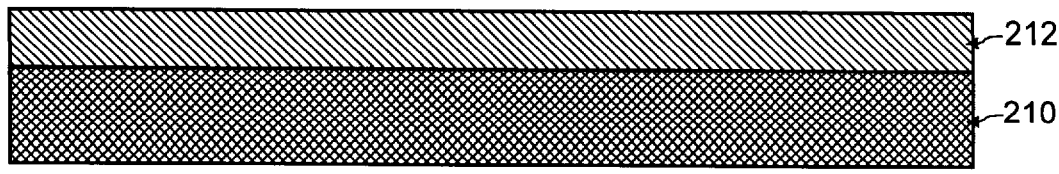

Referring to FIGS. 7 and 8, a thermal anneal is performed to heat up the first layer of material 232 and the second layer of material 234 using a temperature between about 100° Celsius to about 400° Celsius for a time period of from about 2 seconds to about 5 minutes, according to one embodiment of the present invention. With such a thermal anneal process, the alloy doping element is more evenly mixed and distributed within the bulk material to form the alloy material 212 on the underlying diffusion barrier material 210. The present invention may be practiced with or without such a thermal anneal process. Referring to FIGS. 2 and 3, after formation of the alloy material 212 on the diffusion barrier material 210, the conformal seed layer 214 is deposited on the alloy material 212 when the alloy material 212 and the diffusion barrier material 210 are formed within the interconnect opening 202.

Figure 9:
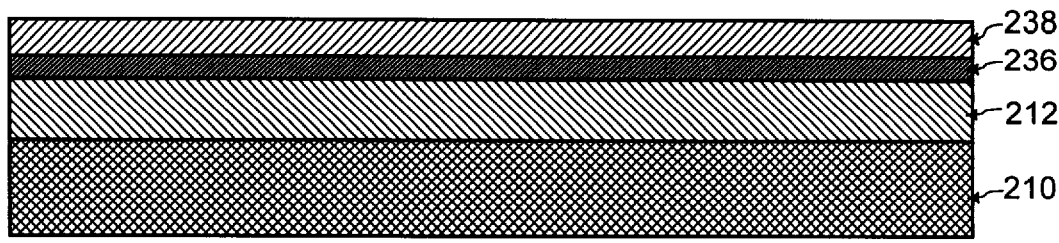

In an alternative embodiment of the present invention, referring to FIG. 9, for increasing the thickness of the alloy material formed on the underlying diffusion barrier material 210, the alternating depositions of the first layer of material 232 and the second layer of material 234 are repeated. Referring to FIG. 9, a third layer of material 236 that is comprised of substantially the same material as the first layer of material 232 is deposited on the alloy material 212 already formed in FIG. 8 using the first type of deposition process used for depositing the first layer of material 232. In addition, a fourth layer of material 238 that is comprised of substantially the same material as the second layer of material 234 is deposited on the third layer of material 236 using the second type of deposition process also used for depositing the second layer of material 234.

Figure 10:
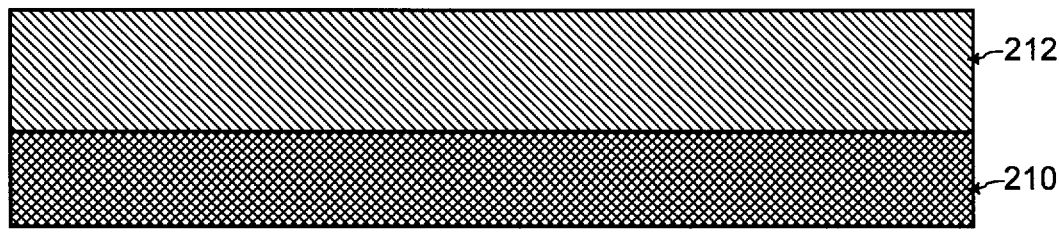

Referring to FIG. 10, another thermal anneal process is performed to heat up the third layer of material 236 and the fourth layer of material 238 using a temperature between about 100° Celsius to about 400° Celsius for a time period of from about 2 seconds to about 5 minutes, according to one embodiment of the present invention. With such a thermal anneal process, the alloy doping element is more evenly mixed and distributed within the bulk material of the third and fourth layers of material 236 and 238 to add to the thickness of the alloy material 212 on the underlying diffusion barrier material 210. The present invention may be practiced with or without such a thermal anneal process.

Figure 11:
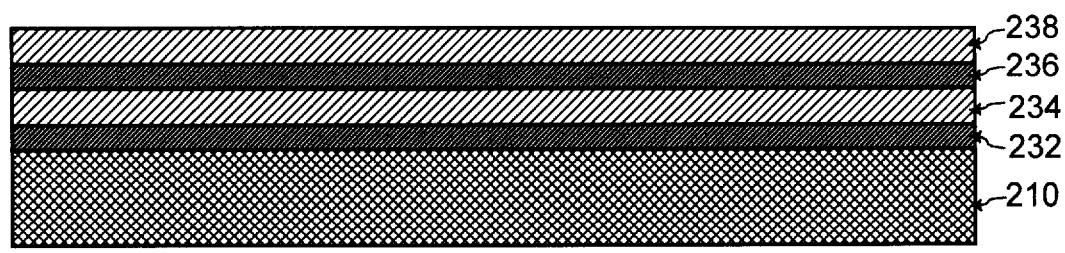

Referring to FIG. 11, in another embodiment of the present invention, the alternating depositions of the multiple layers of material are repeated before any thermal anneal process is performed for more evenly distributing the alloy doping element within the bulk material. Referring to FIG. 11, the first layer of material 232 is deposited on the underlying diffusion barrier material 210 using the first type of deposition process, and the second layer of material 234 is deposited on the first layer of material 232 using the second type of deposition process. Then, before a thermal anneal process is performed, the third layer of material 236 that is comprised of substantially the same material as the first layer of material 232 is deposited on the second layer of material 234 using the first type of deposition process used for depositing the first layer of material 232. In addition, the fourth layer of material 238 that is comprised of substantially the same material as the second layer of material 234 is deposited on the third layer of material 236 using the second type of deposition process also used for depositing the second layer of material 234.

Referring to FIG. 11, after deposition of the first, second, third, and fourth layers of material 232, 234, 236, and 238, a thermal anneal process is performed to heat up the first, second, third, and fourth layers of material 232, 234, 236, and 238 using a temperature between about 100° Celsius to about 400° Celsius for a time period of from about 2 seconds to about 5 minutes, according to one embodiment of the present invention. With such a thermal anneal process, the alloy doping element is more evenly mixed and distributed within the bulk material of the first, second, third, and fourth layers of material 232, 234, 236, and 238 to form the alloy material 212 on the underlying diffusion barrier material 210, as illustrated in FIG. 10. However, the present invention may be practiced with or without such a thermal anneal process.

Figure 4:
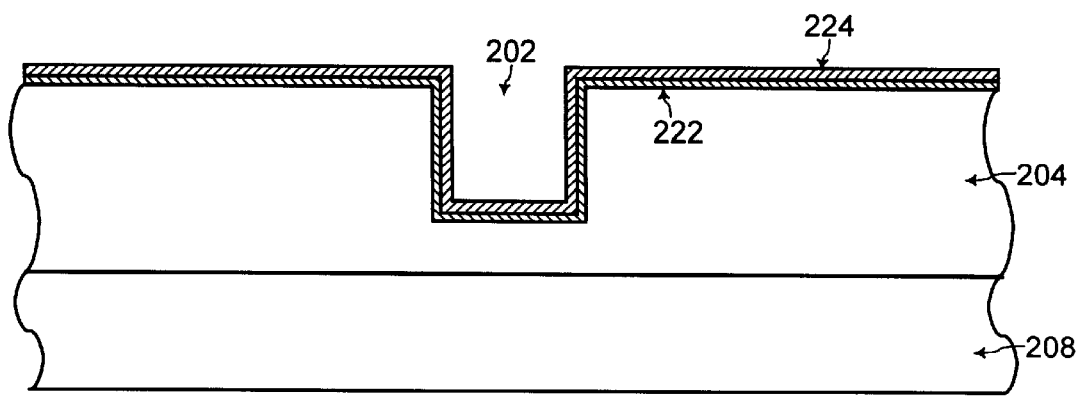
FIG. 4 shows a cross-sectional view of an adhesion skin layer and a conformal seed layer deposited on the dielectric material at the sidewalls and the bottom wall of the interconnect opening when a diffusion barrier material is not used.
Figure 5:
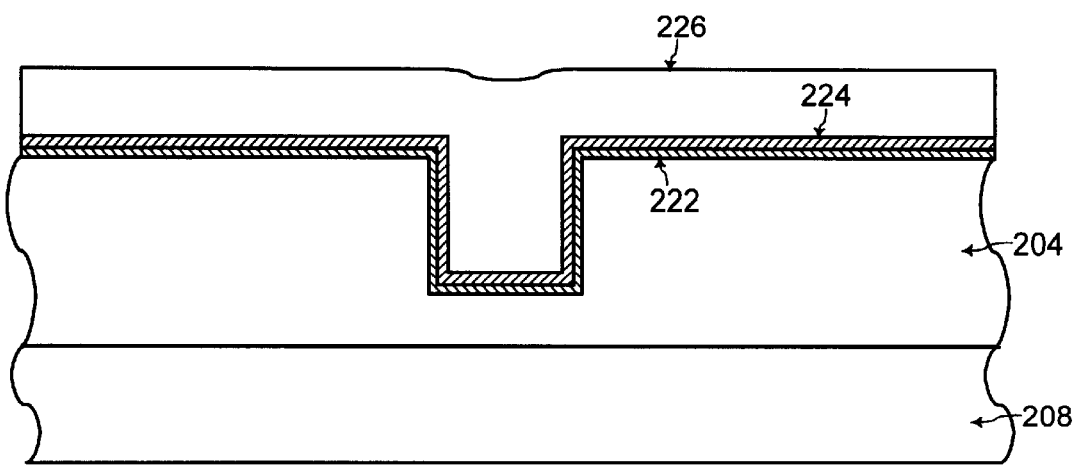
FIG. 5 shows a conductive material plated from the conformal seed layer of FIG. 4 for filling the interconnect opening.

FIGS. 6, 7, 8, 9, 10, and 11 show deposition of an alloy material on an underlying diffusion barrier material. In another embodiment of the present invention, the alloy material is formed on an underlying dielectric material without corrosion of the underlying dielectric material. Referring to FIGS. 4 and 5, the alloy material of the adhesion skin layer 222 is deposited on the dielectric material of the insulating layer 204 surrounding the insulating opening 202 when a diffusion barrier material is not used. The fluorine precursor used in a CVD (chemical vapor deposition) process for depositing the alloy material of the adhesion skin layer 222 is likely to corrode the exposed dielectric material of the insulating layer 204.

Figure 12:
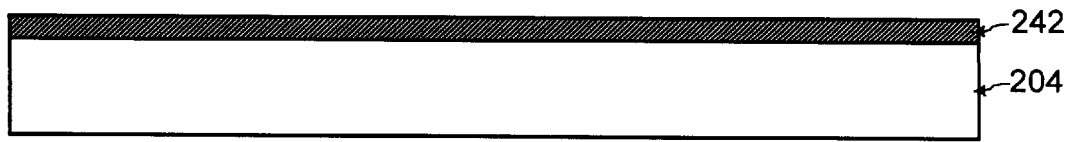
FIGS. 12, 13, 14, 15, 16, and 17 show cross-sectional views for formation of an alloy material on a dielectric material as the underlying material by using alternating depositions of a plurality of layers of material to avoid corrosion of the underlying dielectric material, according to another embodiment of the present invention. Corrosion to the underlying material is undesired because corrosion to the underlying material may degrade the adhesion of the interconnect to the underlying material to increase undesired electromigration failure of the interconnect.

Referring to FIG. 12, for forming the alloy material on the underlying dielectric material of the insulating layer 204 without corrosion of the underlying insulating layer 204, a first layer of material 242 is deposited on the underlying dielectric material of the insulating layer 204. The first layer of material 242 is comprised of the alloy doping element and is deposited using a first type of deposition process that is corrosion resistive to the underlying insulating layer 204 during deposition of the first layer of material 242. An example of a type of deposition process that is corrosion resistive to the underlying insulating layer 204 is an ALD (atomic layer deposition) process which may be used for depositing the first layer of material 242. On the other hand, the conventional CVD (chemical vapor deposition) process typically uses a corrosive fluorine precursor, and such a deposition process is avoided as the first type of deposition process for depositing the first layer of material 242.

In one embodiment of the present invention, the first layer of material 242 is the substantially pure alloy doping element. For example, for forming a copper alloy, the first layer of material 242 is comprised of one of substantially pure tungsten or substantially pure tin, according to one embodiment of the present invention. In an alternative embodiment of the present invention, the first layer of material 242 is a copper alloy having a relatively large concentration of the alloy doping element. For example, the first layer of material 242 is comprised of a copper alloy with the alloy doping element being one of tungsten, tin, aluminum, phosphorous, or nickel having a concentration of greater than about 10 atomic percent in copper as the bulk material. ALD (atomic layer deposition) processes which may be used for depositing such a first layer of material 242 are known to one of ordinary skill in the art of integrated circuit fabrication.

Figure 13:
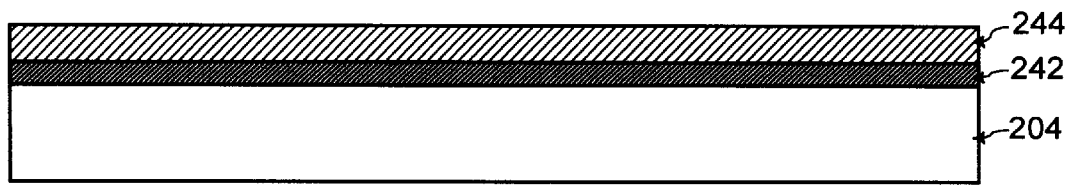

Referring to FIG. 13, after deposition of the first layer of material 242 using the first type of deposition process, a second layer of material 244 is deposited on the first layer of material 242 using a second type of deposition process. The second layer of material 244 comprises the bulk material of the alloy material to be formed on the underlying dielectric material of the insulating layer 204. For example, for forming a copper alloy, the second layer of material 244 is comprised of substantially pure copper according to one embodiment of the present invention. In an alternative embodiment of the present invention, the second layer of material 244 is a copper alloy having a relatively small concentration of the alloy doping element. For example, the second layer of material 244 is comprised of a copper alloy with the alloy doping element being one of tungsten, tin, aluminum, phosphorous, or nickel having a concentration of less than about 0.1 atomic percent in copper as the bulk material.

In one embodiment of the present invention, the second type of deposition process for depositing the second layer of material 244 is the same as the first type of deposition process for depositing the first layer of material 242. For example, when the ALD (atomic layer deposition) process is the first type of deposition process for depositing the first layer of material 242, the ALD (atomic layer deposition) process may also be the second type of deposition process for depositing the second layer of material 244. In that case, the thickness of the first layer of material 242 deposited using the ALD (atomic layer deposition) process is in a range of from about 3 angstroms to about 50 angstroms, and the thickness of the second layer of material 244 deposited using the ALD (atomic layer deposition) process is in a range of from about 3 angstroms to about 100 angstroms.

However, as known to one of ordinary skill in the art of integrated circuit fabrication, ALD (atomic layer deposition) processes are relatively slow (slower than CVD (chemical vapor deposition) processes) for depositing material. Thus, in an alternative embodiment of the present invention, the second type of deposition process for depositing the second layer of material 244 is different from the first type of deposition process for depositing the first layer of material 242.

In one embodiment of the present invention, the first type of deposition process for depositing the first layer of material 242 on the underlying dielectric material of the insulating layer 204 is the ALD (atomic layer deposition) process that is corrosion resistive to the underlying dielectric material of the insulating layer 204. The second type of deposition process for depositing the second layer of material 244 is the CVD (chemical vapor deposition) process such that the second layer of material 244 may be deposited at a faster rate. In that case, the thickness of the first layer of material 242 deposited using the ALD (atomic layer deposition) process is in a range of from about 3 angstroms to about 50 angstroms, and the thickness of the second layer of material 244 deposited using the CVD (chemical vapor deposition) process is in a range of from about 3 angstroms to about 100 angstroms.

CVD (chemical vapor deposition) processes are faster than ALD (atomic layer deposition) processes for depositing material as known to one of ordinary skill in the art of integrated circuit fabrication. In addition, since the underlying dielectric material of the insulating layer 204 is covered by the first layer of material 242, the underlying dielectric material of the insulating layer 204 is not exposed to the fluorine precursor used during the CVD (chemical vapor deposition) process as the second type of deposition process for depositing the second layer of material 244.

Figure 14:
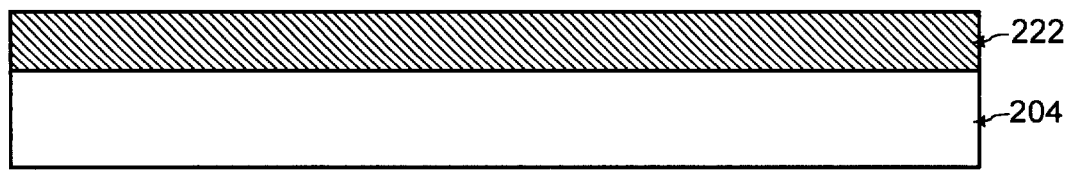

Referring to FIGS. 13 and 14, a thermal anneal is performed to heat up the first layer of material 242 and the second layer of material 244 using a temperature between about 100° Celsius to about 400° Celsius for a time period of from about 2 seconds to about 5 minutes, according to one embodiment of the present invention. With such a thermal anneal process, the alloy doping element is more evenly mixed and distributed within the bulk material to form the alloy material 222 on the underlying dielectric material of the insulating layer 204. The present invention may be practiced with or without such a thermal anneal process. Referring to FIGS. 4 and 5, after formation of the alloy material 222 on the underlying dielectric material of the insulating layer 204, the conformal seed layer 224 is deposited on the alloy material 222 when the alloy material 222 is formed within the interconnect opening 202.

Figure 15:
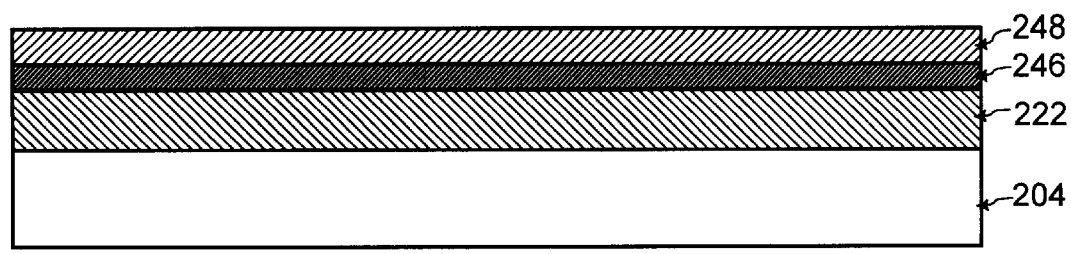

In an alternative embodiment of the present invention, referring to FIG. 15, for increasing the thickness of the alloy material formed on the underlying dielectric material of the insulating layer 204, the alternating depositions of the first layer of material 242 and the second layer of material 244 are repeated. Referring to FIG. 15, a third layer of material 246 that is comprised of substantially the same material as the first layer of material 242 is deposited on the alloy material 222 already formed in FIG. 14 using the first type of deposition process used for depositing the first layer of material 242. In addition, a fourth layer of material 248 that is comprised of substantially the same material as the second layer of material 244 is deposited on the third layer of material 246 using the second type of deposition process also used for depositing the second layer of material 244.

Figure 16:
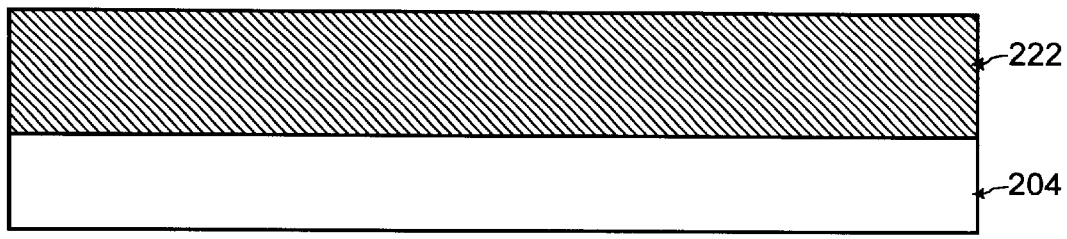

Referring to FIG. 16, another thermal anneal process is performed to heat up the third layer of material 246 and the fourth layer of material 248 using a temperature between about 100° Celsius to about 400° Celsius for a time period of from about 2 seconds to about 5 minutes, according to one embodiment of the present invention. With such a thermal anneal process, the alloy doping element is more evenly mixed and distributed within the bulk material of the third and fourth layers of material 246 and 248 to add to the thickness of the alloy material 222 on the underlying dielectric material of the insulating layer 204.

Figure 17:
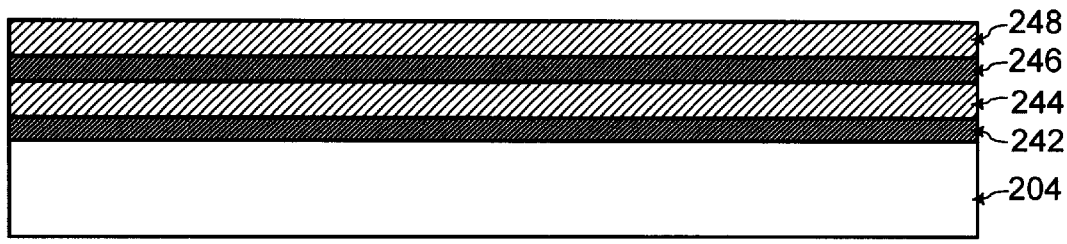

Referring to FIG. 17, in another embodiment of the present invention, the alternating depositions of the multiple layers of material are repeated before any thermal anneal process is performed for more evenly distributing the alloy doping element within the bulk material for the alloy material deposited on the underlying dielectric material of the insulating layer 204. Referring to FIG. 17, the first layer of material 242 is deposited on the underlying dielectric material of the insulating layer 204 using the first type of deposition process, and the second layer of material 244 is deposited on the first layer of material 242 using the second type of deposition process. Then, before a thermal anneal process is performed, the third layer of material 246 that is comprised of substantially the same material as the first layer of material 242 is deposited on the second layer of material 244 using the first type of deposition process used for depositing the first layer of material 242. In addition, the fourth layer of material 248 that is comprised of substantially the same material as the second layer of material 244 is deposited on the third layer of material 246 using the second type of deposition process also used for depositing the second layer of material 244.

Referring to FIG. 17, after deposition of the first, second, third, and fourth layers of material 242, 244, 246, and 248, a thermal anneal process is performed to heat up the first, second, third, and fourth layers of material 242, 244, 246, and 248 using a temperature between about 100° Celsius to about 400° Celsius for a time period of from about 2 seconds to about 5 minutes, according to one embodiment of the present invention. With such a thermal anneal process, the alloy doping element is more evenly mixed and distributed within the bulk material of the first, second, third, and fourth layers of material 242, 244, 246, and 248 to form the alloy material 212 on the underlying dielectric material of the insulating layer 204, as illustrated in FIG. 10. The present invention may be practiced with or without such a thermal anneal process In this manner, a plurality of deposition processes are used for forming a stack of layers of materials comprising the alloy material to be formed on the underlying material. The first type of deposition process for depositing the first layer of material on the underlying material is corrosion resistive to the underlying material according to one aspect of the present invention. The second deposition process for depositing the second layer of material on the first layer of material may be a faster process for depositing the bulk material of the alloy. In any case, the alloy doping element of the first layer of material deposited on the underlying material promotes adhesion of the alloy material to the underlying material.

The foregoing is by way of example only and is not intended to be limiting. For example, the present invention is described for formation of an alloy material comprising the adhesion skin layer 212 or 222 of FIGS. 2, 3, 4, and 5. However, the present invention may be applied for forming alloy material on an underlying material while avoiding corrosion of the underlying material for other applications, as would be apparent to one of ordinary skill in the art of integrated circuit fabrication from the description herein.

In another embodiment of the present invention, the second layer of material 234 in FIG. 7 or 244 in FIG. 13 is used as a conformal seed layer similar to the conformal seed layer 214 of FIG. 3 or 224 of FIG. 5. The first layer of material 232 of FIG. 7 or 242 of FIG. 13 is comprised of the alloy doping element deposited with a first type of deposition process that is corrosion resistive to the underlying material 210 or 204 such as an ALD (atomic layer deposition) process as described herein. The first layer of material 232 of FIG. 7 or 242 of FIG. 13 is comprised of the alloy doping element that is substantially pure such as substantially pure tungsten or substantially pure tin, or is comprised of an alloy such as copper alloy with the alloy doping element being one of tungsten, tin, aluminum, phosphorous, or nickel having a concentration of less than about 0.1 atomic percent in copper as the bulk material, according to an example embodiment of the present invention.

The second layer of material 234 in FIG. 7 or 244 in FIG. 13 is used as a conformal seed layer similar to the conformal seed layer 214 of FIG. 3 or 224 of FIG. 5, especially when the second layer of material 234 in FIG. 7 or 244 in FIG. 13 has a high thickness of greater than about 100 angstroms. In one embodiment of the present invention, the second layer of material 234 in FIG. 7 or 244 in FIG. 13 is a conformal seed layer comprised of substantially pure bulk material such as copper. Such a conformal seed layer 234 in FIG. 7 or 244 in FIG. 13 is deposited in a conformal deposition process such as a CVD (chemical-vapor-deposition) process and has a relatively high thickness of greater than about 100 angstroms, according to one embodiment of the present invention. Referring to FIGS. 3 or 5, a conductive fill of the bulk material 216 or 226 is plated from the conformal seed layer 234 in FIG. 7 or 244 in FIG. 13 to fill the interconnect opening 202.

Furthermore, as will be understood by those skilled in the art, the structures described herein may be made or used in the same way regardless of their position and orientation. Accordingly, it is to be understood that terms and phrases such as "top," "bottom," and "sidewall" as used herein refer to relative location and orientation of various portions of the structures with respect to one another, and are not intended to suggest that any particular absolute orientation with respect to external objects is necessary or required. In addition, any specified materials or dimensions are by way of example only.

The present invention is limited only as defined in the following claims and equivalents thereof.

We claim:

1. An interconnect structure comprising:

an alloy material deposited onto an underlying material within an interconnect opening, said alloy material comprising an alloy doping element mixed into a bulk material, and said alloy material initially being a stack including:

a first layer of material comprising said alloy doping element and disposed on said underlying material; and a second layer of material comprising said bulk material and disposed on said first layer of material;

wherein said alloy doping element of said first layer of material deposited on said underlying material promotes adhesion of said alloy material to said underlying material;

a conformal seed layer deposited on said alloy material; and a conductive material grown from said conformal seed layer for filling said interconnect opening.

2. The interconnect structure of claim 1, wherein said alloy doping element is mixed into said bulk material to form said alloy material on said underlying material during a thermal anneal process that heats said first layer of material and said second layer of material.

3. The interconnect structure of claim 1, wherein said first layer of material is comprised of said alloy doping element that is substantially pure.

4. The interconnect structure of claim 3, wherein said first layer of material is comprised of one of substantially pure tungsten or substantially pure tin.

5. The interconnect structure of claim 1, wherein said first layer of material is comprised of a copper alloy doped with said alloy doping element being one of tungsten, tin, aluminum, phosphorous, or nickel with a concentration greater than about 10 atomic percent in copper as the bulk material.

6. The interconnect structure of claim 1, wherein said second layer of material is comprised of substantially pure copper.

7. The interconnect structure of claim 1, wherein said second layer of material is comprised of a copper alloy doped with said alloy doping element being one of tungsten, tin, aluminum, phosphorous, or nickel with a concentration less than about 0.1 atomic percent in copper as the bulk material.

8. The interconnect structure of claim 1, further comprising:

a stack of said first layer of material and said second layer of material that alternates a plurality of times for forming said alloy material.

9. The interconnect structure of claim 1, wherein said underlying material is a diffusion barrier material deposited on sidewalls and a bottom wall of said interconnect opening, and wherein said alloy material is a copper alloy formed between said diffusion barrier material and said conformal seed layer of substantially pure copper formed on said alloy material, and wherein said conductive material filling said interconnect opening is substantially pure copper plated from said conformal seed layer.

10. The interconnect structure of claim 1, wherein said underlying material is a dielectric material of an insulating layer surrounding said interconnect opening, and wherein said alloy material is a copper alloy formed between said dielectric material of said insulating layer surrounding said interconnect opening and said conformal seed layer of substantially pure copper formed on said alloy material, and wherein said conductive material filling said interconnect opening is substantially pure copper plated from said conformal seed layer.

11. A method for forming an alloy material on an underlying material within an interconnect opening, said alloy material comprising an alloy doping element mixed into a bulk material, the method including the steps of:
    A. depositing a first layer of material including said alloy doping element on said underlying material using a first type of deposition process that is corrosion resistive to said underlying material;
    B. depositing a conformal seed layer including said bulk material on said first layer of material using a second type of deposition process;
        and wherein said alloy doping element of said first layer of material deposited on said underlying material promotes adhesion of said conformal seed layer to said underlying material; and
    C. filling said interconnect opening with said bulk material by plating said bulk material from said conformal seed layer.

12. The method of claim 11, wherein said second type of deposition process for depositing said conformal seed layer is a conformal deposition process.

13. The method of claim 12, wherein said second type of deposition process for depositing said conformal seed layer is a CVD (chemical-vapor-deposition) process.

14. The method of claim 11, wherein said first type of deposition process is the same as said second type of deposition process.

15. The method of claim 14, wherein said first type of deposition process is an ALD (atomic layer deposition) process for depositing said first layer of material having a thickness in a range of from about 3 angstroms to about 50 angstroms, and wherein said second type of deposition process is an ALD (atomic layer deposition) process for depositing said conformal seed layer having a thickness that is greater than about 100 angstroms.

16. The method of claim 11, wherein said first type of deposition process is different from said second type of deposition process.

17. The method of claim 16, wherein said first type of deposition process is an ALD (atomic layer deposition) process for depositing said first layer of material having a thickness in a range of from about 3 angstroms to about 50 angstroms, and wherein said second type of deposition process is a CVD (chemical vapor deposition) process for depositing said second layer of material having a thickness that is greater than about 100 angstroms.

18. The method of claim 11, wherein said first layer of material is comprised of said alloy doping element that is substantially pure.

19. The method of claim 18, wherein said first layer of material is comprised of one of substantially pure tungsten or substantially pure tin.

20. The method of claim 19, wherein said conformal seed layer is comprised of substantially pure copper.

21. The method of claim 11, wherein said first layer of material is comprised of a copper alloy doped with said alloy doping element being one of tungsten, tin, aluminum, phosphorous, or nickel with a concentration greater than about 10 atomic percent in copper as the bulk material.

22. The method of claim 11, wherein said conformal seed layer is comprised of substantially pure copper.

23. The method of claim 11, wherein said conformal seed layer is comprised of a copper alloy doped with said alloy doping element being one of tungsten, tin, aluminum, phosphorous, or nickel with a concentration less than about 0.1 atomic percent in copper as the bulk material.

24. The method of claim 11, wherein said underlying material is a diffusion barrier material deposited on sidewalls and a bottom wall of said interconnect opening.

25. The method of claim 11, wherein said underlying material is a dielectric material of an insulating layer surrounding said interconnect opening.

* * * * *